(12) United States Patent
Forrest et al.

(10) Patent No.: US 6,310,360 B1
(45) Date of Patent: Oct. 30, 2001

(54) INTERSYSTEM CROSSING AGENTS FOR EFFICIENT UTILIZATION OF EXCITONS IN ORGANIC LIGHT EMITTING DEVICES

(75) Inventors: Stephen R. Forrest, Princeton, NJ (US); Mark E. Thompson, Anaheim, CA (US); Marc A. Baldo, Princeton, NJ (US)

(73) Assignees: The Trustees of Princeton University, Princeton, NJ (US); The University of Southern California, Los Angeles, CA (US)

(*) Notice: Subject to any disclaimer, the term of this patent is extended or adjusted under 35 U.S.C. 154(b) by 0 days.

(21) Appl. No.: 09/358,731

(22) Filed: Jul. 21, 1999

(51) Int. Cl.[7] .................................................. H01L 51/00
(52) U.S. Cl. .............................. 257/40; 257/87; 257/89; 257/102; 257/103; 438/99
(58) Field of Search ............................ 257/40, 87, 89, 257/102, 103; 438/22, 29, 47, 99; 313/498, 502, 503, 504, 506

(56) References Cited

U.S. PATENT DOCUMENTS

| | | | |
|---|---|---|---|
| 5,757,139 | 5/1998 | Forrest et al. . | |
| 5,811,833 | 9/1998 | Thompson . | |
| 5,811,834 * | 9/1998 | Tamano et al. ........................ | 257/40 |
| 5,834,893 | 11/1998 | Bulovic et al. . | |
| 5,844,363 | 12/1998 | Gu et al. . | |
| 5,861,219 | 1/1999 | Thompson et al. . | |
| 5,917,280 | 6/1999 | Burrows et al. . | |
| 5,932,895 | 8/1999 | Shen et al. . | |
| 5,989,738 * | 11/1999 | Haase et al. ........................ | 428/690 |
| 6,013,429 * | 1/2000 | Franke et al. ........................ | 430/551 |
| 6,091,382 * | 7/2000 | Shioya et al. ........................ | 345/76 |

FOREIGN PATENT DOCUMENTS

| | | |
|---|---|---|
| 96/19792 | 6/1996 | (WO) . |
| 97/33296 | 9/1997 | (WO) . |
| 97/48115 | 12/1997 | (WO) . |
| 97/48139 | 12/1997 | (WO) . |

OTHER PUBLICATIONS

C.W. Tang, et al., "Organic Electroluminescent Diodes", 51 *Appl. Phys. Lett.*, 913 (1987).

(List continued on next page.)

*Primary Examiner*—Eddie Lee
*Assistant Examiner*—N. Drew Richards
(74) *Attorney, Agent, or Firm*—Kenyon & Kenyon

(57) ABSTRACT

Organic light emitting devices are described wherein the emissive layer comprises a host material containing a fluorescent or phosphorescent emissive molecule, which molecule is adapted to luminesce when a voltage is applied across the heterostructure, wherein an intersystem crossing molecule of optical absorption spectrum matched to the emission spectrum of the emissive molecule enhances emission efficiency.

19 Claims, 6 Drawing Sheets

OTHER PUBLICATIONS

Figure 1:
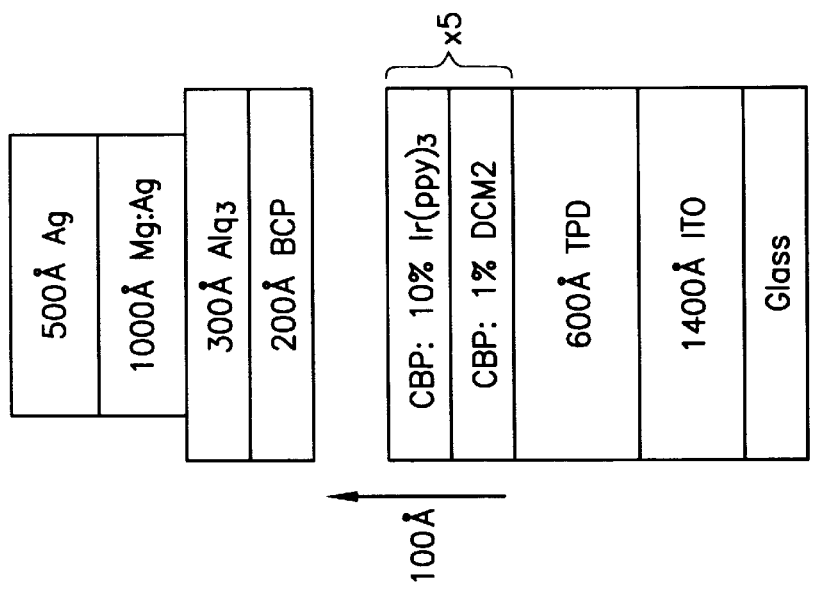
Figure 1:
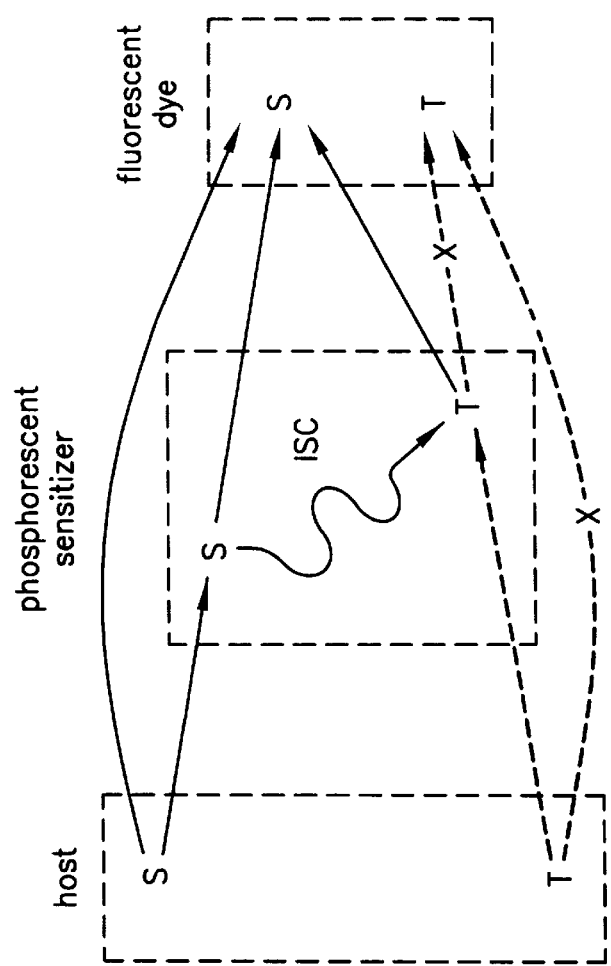

S.R. Forrest, et al., "Organic Emitters Promise a New Generation of Displays", *Laser Focus World*, (Feb. 1995).

Gary L. Miessler, et al., *Inorganic Chemistry*, 2nd Edition, Prentice–Hall (1998).

H. Zollinger, *Color Chemistry*, VCH Publishers, (1991).

H.J.A. Dartnall, et al., 220 *Proc. Roy. Soc. B* (London), 115–130 (1983).

Baldo, et al., "Very high efficiency green organic light–emitting devices based on electrophosphorescence", 75 *Applied Physics Letters*, 4–6, (1999).

C.H. Chen, et al., "Recent developments in molecular organic electroluminscent materials", *Macromolecular Symposia*, 125, 1–48 (1997).

D.F. O'Brien, et al., "Improved energy transfer in electrophosphorescent devices", *Applied Physics Letters*, vol. 74, No. 3, 442–444, (Jan. 1999).

M.A. Baldo, et al., "Highly efficient phosphorescent emission from organic electroluminescent devices", *Nature*, vol. 395, 151–154, (Sep. 1998).

A. Shoustikov, et al., "Electroluminescence Color Tuning by Dye Doping in Organic Light Emitting Diodes," *IEEE Journal of Special Topics in Quantum Electronics*, 4, 3–14, (1998).

C.W. Tang, et al., "Electroluminescence of doped organic films," 65 *J. Appl. Phys.*, 3610–3616, (1989).

V. Bulovic, et al., "Bright, saturated, red–to–yellow organic light–emitting devices based on polarization–induced spectral shifts," *Chem. Phys. Lett.*, 287, 455–460 (1998).

C. H. Chen, et al., "Improved red dopants for organic luminescent devices," *Macromolecular Symposia*, 125, 49–58, (1997).

V. Bulovic, et al., "Tuning the color emission of thin film molecular organic light emitting devices by the solid state solvation effect," *Chemical Physics Letters*, (1999).

S. R. Forrest, "Ultrathin Organic Films Grown by Organic Molecular Beam Deposition and Related Techniques," Chemical Reviews, 1997, 97, pp. 1793–1896.

* cited by examiner

INTERSYSTEM CROSSING AGENTS FOR EFFICIENT UTILIZATION OF EXCITONS IN ORGANIC LIGHT EMITTING DEVICES

I. FIELD OF INVENTION

The present invention is directed to organic light emitting devices (OLEDs) comprised of emissive layers that contain an organic compound functioning as an emitter and a separate intersystem crossing ("ISC") entity which operates to enhance the efficiency of the emission.

II. BACKGROUND OF THE INVENTION

II. A. General Background

Organic light emitting devices (OLEDs) are comprised of several organic layers in which one of the layers is comprised of an organic material that can be made to electroluminesce by applying a voltage across the device, C. W. Tang et al., Appl. Phys. Lett. 1987, 51, 913. Certain OLEDs have been shown to have sufficient brightness, range of color and operating lifetimes for use as a practical alternative technology to LCD-based full color flat-panel displays (S. R. Forrest, P. E. Burrows and M. E. Thompson, Laser Focus World, Feb. 1995). Since many of the thin organic films used in such devices are transparent in the visible spectral region, they allow for the realization of a completely new type of display pixel in which red (R), green (G), and blue (B) emitting OLEDs are placed in a vertically stacked geometry to provide a simple fabrication process, a small R-G-B pixel size, and a large fill factor, International Patent Application No. PCT/US95/15790.

A transparent OLED (TOLED), which represents a significant step toward realizing high resolution, independently addressable stacked R-G-B pixels, was reported in International Patent Application No. PCT/US97/02681 in which the TOLED had greater than 71% transparency when turned off and emitted light from both top and bottom device surfaces with high efficiency (approaching 1% quantum efficiency) when the device was turned on. The TOLED used transparent indium tin oxide (ITO) as the hole-injecting electrode and a Mg—Ag-ITO electrode layer for electron-injection. A device was disclosed in which the ITO side of the Mg—Ag-ITO layer was used as a hole-injecting contact for a second, different color-emitting OLED stacked on top of the TOLED. Each layer in the stacked OLED (SOLED) was independently addressable and emitted its own characteristic color. This colored emission could be transmitted through the adjacently stacked, transparent, independently addressable, organic layer or layers, the transparent contacts and the glass substrate, thus allowing the device to emit any color that could be produced by varying the relative output of the red and blue color-emitting layers.

PCT/US95/15790 application disclosed an integrated SOLED for which both intensity and color could be independently varied and controlled with external power supplies in a color tunable display device. The PCT/US95/15790 application, thus, illustrates a principle for achieving integrated, full color pixels that provide high image resolution, which is made possible by the compact pixel size. Furthermore, relatively low cost fabrication techniques, as compared with prior art methods, may be utilized for making such devices.

II.B. Background of emission

II.B.1. Basics

II.B.1.a. Singlet and Triplet Excitons

Because light is generated in organic materials from the decay of molecular excited states or excitons, understanding their properties and interactions is crucial to the design of efficient light emitting devices currently of significant interest due to their potential uses in displays, lasers, and other illumination applications. For example, if the symmetry of an exciton is different from that of the ground state, then the radiative relaxation of the exciton is disallowed and luminescence will be slow and inefficient. Because the ground state is usually anti-symmetric under exchange of spins of electrons comprising the exciton, the decay of a symmetric exciton breaks symmetry. Such excitons are known as triplets, the term reflecting the degeneracy of the state. For every three triplet excitons that are formed by electrical excitation in an OLED, only one symmetric state (or singlet) exciton is created. (M. A. Baldo, D. F. O'Brien, M. E. Thompson and S. R. Forrest, Very high-efficiency green organic light-emitting devices based on electrophosphorescence, Applied Physics Letters, 1999, 75, 4–6.) Luminescence from a symmetry-disallowed process is known as phosphorescence. Characteristically, phosphorescence may persist for up to several seconds after excitation due to the low probability of the transition. In contrast, fluorescence originates in the rapid decay of a singlet exciton. Since this process occurs between states of like symmetry, it may be very efficient.

Many organic materials exhibit fluorescence from singlet excitons. However, only a very few have been identified which are also capable of efficient room temperature phosphorescence from triplets. Thus, in most fluorescent dyes, the energy contained in the triplet states is wasted. However, if the triplet excited state is perturbed, for example, through spin-orbit coupling (typically introduced by the presence of a heavy metal atom), then efficient phosphoresence is more likely. In this case, the triplet exciton assumes some singlet character and it has a higher probability of radiative decay to the ground state. Indeed, phosphorescent dyes with these properties have demonstrated high efficiency electroluminescence.

Only a few organic materials have been identified which show efficient room temperature phosphorescence from triplets. In contrast, many fluorescent dyes are known (C. H. Chen, J. Shi, and C. W. Tang, "Recent developments in molecular organic electroluminescent materials," Macromolecular Symposia, 1997, 125, 1–48; U. Brackmann, Lambdachrome Laser Dyes (Lambda Physik, Gottingen, 1997) and fluorescent efficiencies in solution approaching 100% are not uncommon. (C. H. Chen, 1997, op. cit.) Fluorescence is also not affected by triplet-triplet annihilation, which degrades phosphorescent emission at high excitation densities. (M. A. Baldo, et al., "High efficiency phosphorescent emission from organic electroluminescent devices," Nature, 1998, 395, 151–154; M. A. Baldo, M. E. Thompson, and S. R. Forrest, "An analytic model of triplet-triplet annihilation in electrophosphorescent devices," 1999). Consequently, fluorescent materials are suited to many electroluminescent applications, particularly passive matrix displays.

II.B.1.b. Overview of invention relative to basics

This invention pertains to the use of intersystem crossing agents to enhance emission efficiency in organic light emitting devices. An intersystem crossing agent, or molecule, is one which can undergo intersystem crossing, which involves the transfer of population between states of different spin multiplicity. Lists of known intersystem crossing agents, or molecules, are given in A. Gilbert and J. Baggott, Essentials of Molecular Photochemistry, Blackwells Scientific, 1991.

In one embodiment of the present invention, we focus on a way to use an intersystem crossing agent to increase efficiency in a system with a fluorescent emitter. Therein, we describe a technique whereby triplets formed in the host material are not wasted, but instead are transferred to the singlet excited state of a fluorescent dye. In this way, all excited states are employed and the overall efficiency of fluorescence increased by a factor of four. In this embodiment, the ISC agent traps the energy of excitons and transfers the energy to the fluorescent emitter by a Forster energy transfer. The energy transfer process desired is:

$$^3D^* + {}^1A \rightarrow {}^1D + {}^1A^* \qquad (\text{Eq. 1})$$

Here, D and A represent a donor molecule and a fluorescent acceptor, respectively. The superscripts 3 and 1 denote the triplet and singlet states, respectively, and the asterisk indicates the excited state.

In a second embodiment of the present invention, we focus on a way to use an intersystem crossing agent to increase efficiency in a system with a phosphorescent emitter. Therein, we describe a technique whereby the ISC agent is responsible for converting all of the excitons from a host material into their triplet states and then transferring that excited state to the phosphorescent emitter. This would include the case wherein the ISC agent only traps singlet excitons on the host and host triplet excitons are transferred directly to the phosphorescent emitter (rather than going through the ISC agent.)

In this second embodiment wherein phosphorescent efficiency is enhanced, a phosphorescent emitter is combined with an intersystem crossing agent such that the following can occur:

$$^1D^* + {}^1X \rightarrow {}^1D + {}^1X^*$$

$$^1X^* \rightarrow {}^3X^*$$

$$^3X^* + {}^1A \rightarrow {}^1X + {}^3A^*$$

$$^3A^* \rightarrow {}^1A + h\nu$$

wherein D represents the donor (host), X represents the intersystem crossing agent, and A represents the acceptor (emissive molecule). Superscript 1 denotes singlet spin multiplicity; superscript 3 denotes triplet spin multiplicity and the asterisk denotes an excited state.

In a third embodiment of the present invention, we focus on a way to use an intersystem crossing agent to increase efficiency by acting as a filter and a converter. In one aspect of the filter/converter embodiment, the intersystem crossing agent acts to convert singlet excitons to triplet excitons, thereby keeping singlets from reaching the emissive region and thus enhancing optical purity (the "filter" aspect: singlets are removed and thus no singlets emit) and increasing efficiency (the "conversion" aspect: singlets are converting to triplets, which do emit).

These embodiments are discussed in more detail in the examples below. However the embodiments may operate by different mechanisms. Without limiting the scope of the invention, we discuss the different mechanisms.

II.B.1.c. Dexter and Förster mechanisms

To understand the different embodiments of this invention it is useful to discuss the underlying mechanistic theory of energy transfer. There are two mechanisms commonly discussed for the transfer of energy to an acceptor molecule. In the first mechanism of Dexter transport (D. L. Dexter, "A theory of sensitized luminescence in solids," J. Chem. Phys., 1953, 21, 836–850), the exciton may hop directly from one molecule to the next. This is a short-range process dependent on the overlap of molecular orbitals of neighboring molecules. It also preserves the symmetry of the donor and acceptor pair (E. Wigner and E. W. Wittmer, Uber die Struktur der zweiatomigen Molekelspektren nach der Quantenmechanik, Zeitschrift fur Physik, 1928, 51, 859–886; M. Klessinger and J. Michl, Excited states and photochemistry of organic molecules (VCH Publishers, New York, 1995). Thus, the energy transfer of Eq. (1) is not possible via Dexter mechanism. In the second mechanism of Förster transfer (T. Förster, Zwischenmolekulare Energiewanderung and Fluoreszenz, Annalen der Physik, 1948, 2, 55–75; T. Förster, Fluoreszenz organischer Verbindugen (Vandenhoek and Ruprecht, Gottinghen, 1951), the energy transfer of Eq. (1) is possible. In Förster transfer, similar to a transmitter and an antenna, dipoles on the donor and acceptor molecules couple and energy may be transferred. Dipoles are generated from allowed transitions in both donor and acceptor molecules. This typically restricts the Förster mechanism to transfers between singlet states.

However, in one embodiment of the present invention, we consider the case where the transition on the donor ($^3D^* \rightarrow {}^1D$) is allowed, i.e. the donor is a phosphorescent molecule. As discussed earlier, the probability of this transition is low because of symmetry differences between the excited triplet and ground state singlet.

Nevertheless, as long as the phosphor can emit light due to some perturbation of the state such as due to spin-orbit coupling introduced by a heavy metal atom, it may participate as the donor in Förster transfer. The efficiency of the process is deternined by the luminescent efficiency of the phosphor (F Wilkinson, in Advances in Photochemistry (eds. W. A. Noyes, G. Hammond, and J. N. Pitts, pp. 241–268, John Wiley & Sons, New York, 1964), i.e. if a radiative transition is more probable than a non-radiative decay, then energy transfer will be efficient. Such triplet-singlet transfers were predicted by Förster (T. Förster, "Transfer mechanisms of electronic excitation," Discussions of the Faraday Society, 1959, 27, 7–17) and confirmed by Ermolaev and Sveshnikova (V. L. Ermolaev and E. B. Sveshnikova, "Inductive-resonance transfer of energy from aromatic molecules in the triplet state," Doklady Akademii Nauk SSSR, 1963, 149, 1295–1298), who detected the energy transfer using a range of phosphorescent donors and fluorescent acceptors in rigid media at 77K or 90K. Large transfer distances are observed, for example, with triphenylamine as the donor and chrysoidine as the acceptor, the interaction range is 52 Å.

The remaining condition for Forster transfer is that the absorption spectrum should overlap the emission spectrum of the donor assuming the energy levels between the excited and ground state molecular pair are in resonance. In Example 1 of this application, we use the green phosphor fac tris(2-phenylpyridine) iridium (Ir(ppy)$_3$; M. A. Baldo, et al., Appl. Phys. Lett., 1999, 75, 4–6) and the red fluorescent dye [2-methyl-6-[2-(2,3,6,7-tetrahydro-1H,5H-benzo[ij] quinolizin-9-yl)ethenyl]-4H-pyran-ylidene] propanedinitrile] ("DCM2"; C. W. Tang, S. A. VanSlyke, and C. H. Chen, "Electroluminescence of doped organic films," J. Appl. Phys., 1989, 65, 3610–3616). DCM2 absorbs in the green, and, depending on the local polarization field (V. Bulovic, et al., "Bright, saturated, red-to-yellow organic light-emitting devices based on polarization-induced spectral shifts," Chem. Phys. Lett., 1998, 287, 455–460), it emits at wavelengths between λ=570 nm and λ=650 nm.

It is possible to implement Forster energy transfer from a triplet state by doping a fluorescent guest into a phosphorescent host material. Unfortunately, such systems are affected by competitive energy transfer mechanisms that degrade the overall efficiency. In particular, the close proximity of the host and guest increase the likelihood of Dexter transfer between the host to the guest triplets. Once excitons reach the guest triplet state, they are effectively lost since these fluorescent dyes typically exhibit extremely inefficient phosphorescence.

Another approach is to dope both the phosphorescent donor and the fluorescent acceptor into a host material. The energy can then cascade from the host, through the phosphor sensitizing molecule and into the fluorescent dye following the equations (collectively Eq. 2):

$$^3D^*+{}^1X\rightarrow{}^1D+{}^3X^*$$

$$^3X^*+{}^1A\rightarrow{}^1X+{}^1A^*$$

$$^1A^*\rightarrow{}^1A+h\nu \qquad (2a)$$

$$^1D^*+{}^1X\rightarrow{}^1D+{}^1X^*$$

$$^1X^*\rightarrow{}^3X^*$$

$$^3X^*+{}^1A\rightarrow{}^1X+{}^1A^*$$

$$^1A^*\rightarrow{}^1A+h\nu \qquad (2b)$$

wherein X represents the sensitizer molecule and hν is the photon energy.

The multiple state energy transfer required in the phosphorescent-sensitized system is schematically described in FIG. 1. Dexter transfers are indicated by dotted arrows, and Forster transfers by solid arrows. Transfers resulting in a loss in efficiency are marked with a cross. In addition to the energy transfer paths shown in the figure, direct electron-hole recombination is possible on the phosphorescent and fluorescent dopants as well as the host. Triplet exciton formation after charge recombination on the fluorescent dye is another potential loss mechanism.

To maximize the transfer of host triplets to fluorescent dye singlets, it is desirable to maximize Dexter transfer into the triplet state of the phosphor while also minimizing transfer into the triplet state of the fluorescent dye. Since the Dexter mechanism transfers energy between neighboring molecules, reducing the concentration of the fluorescent dye decreases the probability of triplet-triplet transfer to the dye. On the other hand, long range Förster transfer to the singlet state is unaffected. In contrast, transfer into the triplet state of the phosphor is necessary to harness host triplets, and may be improved by increasing the concentration of the phosphor. To demonstrate the multiple state transfer, we used 4,4'-N,N'-dicarbazole-biphenyl ("CBP") as the host (D. F. O'Brien, M. A. Baldo, M. E. Thompson, and S. R. Forrest, "Improved energy transfer in electrophosphorescent devices," Appl. Phys. Lett., 1999, 74, 442–444), Ir(ppy)₃ as the phosphorescent sensitizer, and DCM2 as the fluorescent dye. The doping concentration was 10% for Ir(ppy)₃, and 1% for DCM2.

The details, given in Example 1 below, showed the improvement in efficiency of fluorescent yield brought about by the use of the phosphorescent sensitizer. In the following sections, we give additional background.

II.B.2. Interrelation of Device Structure and Emission

Devices whose structure is based upon the use of layers of organic optoelectronic materials generally rely on a common mechanism leading to optical emission. Typically, this mechanism is based upon the radiative recombination of a trapped charge. Specifically, OLEDs are comprised of at least two thin organic layers separating the anode and cathode of the device. The material of one of these layers is specifically chosen based on the material's ability to transport holes, a "hole transporting layer" (HTL), and the material of the other layer is specifically selected according to its ability to transport electrons, an "electron transporting layer" (ETL). With such a construction, the device can be viewed as a diode with a forward bias when the potential applied to the anode is higher than the potential applied to the cathode. Under these bias conditions, the anode injects holes (positive charge carriers) into the hole transporting layer, while the cathode injects electrons into the electron transporting layer. The portion of the luminescent medium adjacent to the anode thus forms a hole injecting and transporting zone while the portion of the luminescent medium adjacent to the cathode forms an electron injecting and transporting zone. The injected holes and electrons each migrate toward the oppositely charged electrode. When an electron and hole localize on the same molecule, a Frenkel exciton is formed. Recombination of this short-lived state may be visualized as an electron dropping from its conduction potential to a valence band, with relaxation occurring, under certain conditions, preferentially via a photoemissive mechanism. Under this view of the mechanism of operation of typical thin-layer organic devices, the electroluminescent layer comprises a luminescence zone receiving mobile charge carriers (electrons and holes) from each electrode.

As noted above, light emission from OLEDs is typically via fluorescence or phosphorescence. There are issues with the use of phosphorescence. It has been noted that phosphorescent efficiency can decrease rapidly at high current densities. It may be that long phosphorescent lifetimes cause saturation of emissive sites, and triplet-triplet annihilation may also produce efficiency losses. Another difference between fluorescence and phosphorescence is that energy transfer of triplets from a conductive host to a luminescent guest molecule is typically slower than that of singlets; the long range dipole-dipole coupling (Förster transfer) which dominates energy transfer of singlets is (theoretically) forbidden for triplets by the principle of spin symmetry conservation. Thus, for triplets, energy transfer typically occurs by diffusion of excitons to neighboring molecules (Dexter transfer); significant overlap of donor and acceptor excitonic wavefunctions is critical to energy transfer. Another issue is that triplet diffusion lengths are typically long (e.g., >1400 Å) compared with typical singlet diffusion lengths of about 200 Å. Thus, if phosphorescent devices are to achieve their potential, device structures need to be optimized for triplet properties.

In this invention, we exploit the property of long triplet diffusion lengths to improve external quantum efficiency.

Successful utilization of phosphorescence holds enormous promise for organic electroluminescent devices. For example, an advantage of phosphorescence is that all excitons (formed by the recombination of holes and electrons in an EL), which are (in part) triplet-based in phosphorescent devices, may participate in energy transfer and luminescence in certain electroluminescent materials. In contrast, only a small percentage of excitons in fluorescent devices, which are singlet-based, result in fluorescent luminescence.

An alternative is to use phosphorescence processes to improve the efficiency of fluorescence processes. Fluorescence is in principle 75% less efficient due the three times higher number of symmetric excited states. In one embodiment of the present invention, we overcome the problem by using a phosphorescent sensitizer molecule to excite a fluorescent material in a red-emitting OLED. The mechanism for energetic coupling between molecular species is a long-range, non-radiative energy transfer from the phosphor to the fluorescent dye. Using this technique, the internal efficiency of fluorescence can be as high as 100%, a result previously only possible with phosphorescence. As shown in Example 1, we employ it to nearly quadruple the efficiency of a fluorescent OLED.

II.C. Background of Materials
II.C.1. Basic Heterostructures

Because one typically has at least one electron transporting layer and at least one hole transporting layer, one has layers of different materials, forming a heterostructure. The materials that produce the electroluminescent emission may be the same materials that function either as the electron transporting layer or as the hole transporting layer. Such devices in which the electron transporting layer or the hole transporting layer also functions as the emissive layer are referred to as having a single heterostructure. Alternatively, the electroluminescent material may be present in a separate emissive layer between the hole transporting layer and the electron transporting layer in what is referred to as a double heterostructure. The separate emissive layer may contain the emissive molecule doped into a host or the emissive layer may consist essentially of the emissive molecule.

That is, in addition to emissive materials that are present as the predominant component in the charge carrier layer, that is, either in the hole transporting layer or in the electron transporting layer, and that function both as the charge carrier material as well as the emissive material, the emissive material may be present in relatively low concentrations as a dopant in the charge carrier layer. Whenever a dopant is present, the predominant material in the charge carrier layer may be referred to as a host compound or as a receiving compound. Materials that are present as host and dopant are selected so as to have a high level of energy transfer from the host to the dopant material. In addition, these materials need to be capable of producing acceptable electrical properties for the OLED. Furthermore, such host and dopant materials are preferably capable of being incorporated into the OLED using materials that can be readily incorporated into the OLED by using convenient fabrication techniques, in particular, by using vacuum-deposition techniques.

II.C.2. Exciton Blocking Layer

The exciton blocking layer used in the devices of the present invention (and previously disclosed in U.S. appl. Ser. No. 09/154,044) substantially blocks the diffusion of excitons, thus substantially keeping the excitons within the emission layer to enhance device efficiency. The material of blocking layer of the present invention is characterized by an energy difference ("band gap") between its lowest unoccupied molecular orbital (LUMO) and its highest occupied molecular orbital (HOMO) In accordance with the present invention, this band gap substantially prevents the diffusion of excitons through the blocking layer, yet has only a minimal effect on the turn-on voltage of a completed electroluminescent device. The band gap is thus preferably greater than the energy level of excitons produced in an emission layer, such that such excitons are not able to exist in the blocking layer. Specifically, the band gap of the blocking layer is at least as great as the difference in energy between the triplet state and the ground state of the host.

For a situation with a blocking layer between a hole-conducting host and the electron transporting layer (as is the case in Example 1, below), one seeks the following characteristics, which are listed in order of relative importance.

1. The difference in energy between the LUMO and HOMO of the blocking layer is greater than the difference in energy between the triplet and ground state singlet of the host material.
2. Triplets in the host material are not quenched by the blocking layer.
3. The ionization potential (IP) of the blocking layer is greater than the ionization potential of the host. (Meaning that holes are held in the host.)
4. The energy level of the LUMO of the blocking layer and the energy level of the LUMO of the host are sufficiently close in energy such that there is less than 50% change in the overall conductivity of the device.
5. The blocking layer is as thin as possible subject to having a thickness of the layer that is sufficient to effectively block the transport of excitons from the emissive layer into the adjacent layer.

That is, to block excitons and holes, the ionization potential of the blocking layer should be greater than that of the HTL, while the electron affinity of the blocking layer should be approximately equal to that of the ETL to allow for facile transport of electrons.

[For a situation in which the emissive ("emitting") molecule is used without a hole transporting host, the above rules for selection of the blocking layer are modified by replacement of the word "host" by "emitting molecule."]

For the complementary situation with a blocking layer between a electron-conducting host and the hole-transporting layer one seeks characteristics (listed in order of importance):

1. The difference in energy between the LUMO and HOMO of the blocking layer is greater than the difference in energy between the triplet and ground state singlet of the host material.
2. Triplets in the host material are not quenched by the blocking layer.
3. The energy of the LUMO of the blocking layer is greater than the energy of the LUMO of the (electron-transporting) host. (Meaning that electrons are held in the host.)
4. The ionization potential of the blocking layer and the ionization potential of the host are such that holes are readily injected from the blocker into the host and there is less than a 50% change in the overall conductivity of the device.
5. The blocking layer is as thin as possible subject to having a thickness of the layer that is sufficient to effectively block the transport of excitons from the emissive layer into the adjacent layer.

[For a situation in which the emissive ("emitting") molecule is used without an electron transporting host, the above rules for selection of the blocking layer are modified by replacement of the word "host" by "emitting molecule."]

II.D. Color

As to colors, it is desirable for OLEDs to be fabricated using materials that provide electroluminescent emission in a relatively narrow band centered near selected spectral regions, which correspond to one of the three primary colors, red, green and blue so that they may be used as a colored layer in an OLED or SOLED. It is also desirable that such compounds be capable of being readily deposited as a thin layer using vacuum deposition techniques so that they may be readily incorporated into an OLED that is prepared entirely from vacuum-deposited organic materials.

U.S. Pat. No. 08/774,333, filed Dec. 23, 1996, is directed to OLEDs containing emitting compounds that produce a saturated red emission.

III. SUMMARY OF THE INVENTION

At the most general level, the present invention is directed to organic light emitting devices comprising an emissive layer wherein the emissive layer comprises an emissive molecule, with a host material (wherein the emissive molecule present as a dopant in said host material) which molecule is adapted to luminesce when a voltage is applied across a heterostructure, wherein the emissive molecule is selected from the group of phosphorescent or fluorescent organic molecules and wherein the device comprises a molecule which can function as an intersystem crossing agent ("ISC molecule") which improves the efficiency of the phosphorescence or fluorescence relative to the situation where the ISC molecule is absent. It is preferred that the emissive molecule and the intersystem crossing molecule be different and it is preferred that there be substantial spectral overlap between the emissive molecule and the intersystem crossing molecule.

In a first embodiment wherein fluorescent efficiency is enhanced, a fluorescent emitter is combined with a phosphorescent sensitizer, which operates as an intersystem crossing agent. The phosphorescent sensitizer may be selected from materials wherein the radiative recombination rate is much greater than the non-radiative rate of recombination. The phosphorescent sensitizer may be selected from the group of cyclometallated organometallic compounds. The metal thereof may be selected from metals of the third row of the periodic table (especially W, Pt, Au, Ir, Os) and any other metals or metal compounds that have strong spin orbit coupling. The phosphorescent sensitizer may be further selected from the group of phosphorescent organometallic iridium or osmium complexes and may be still further selected from the group of phosphorescent cyclometallated iridium or osmium complexes. A specific example of the sensitizer molecule is fac tris(2-phenylpyridine) iridium, denoted $(Ir(ppy)_3)$ of formula

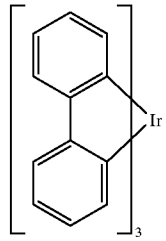

[In this, and later figures herein, we depict the dative bond from nitrogen to metal (here, Ir) as a straight line.]

A specific example of the fluorescent emitter is DCM2, of formula

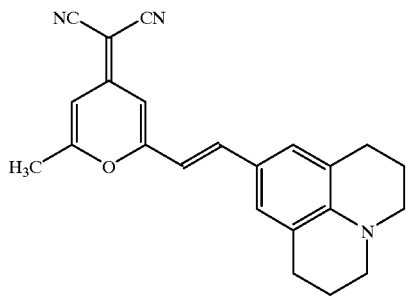

In a second embodiment of the present invention, wherein phosphorescent efficiency is enhanced, a phosphorescent emitter is combined with an intersystem crossing agent such that the following can occur:

$$^1D^* + {}^1X \rightarrow {}^1D + {}^1X^*$$

$$^1X^* \rightarrow {}^3X^*$$

$$^3X^* + {}^1A \rightarrow {}^1X + {}^3A^*$$

$$^3A^* \rightarrow {}^1A + h\nu$$

wherein D represents the donor (host), X represents the intersystem crossing agent, and A represents the acceptor (emissive molecule). Superscript 1 denotes singlet spin multiplicity; superscript 3 denotes triplet spin multiplicity and the asterisk denotes an excited state.

In a third embodiment of the present invention, a thin layer of an ISC agent is placed in the device; it may be between the HTL and ETL. The ISC agent is selected such that the optical absorption spectrum of the ISC agent overlaps strongly with the emission line of the material found at the site of recombination.

The general arrangement of the heterostructure of the devices is such that the layers are ordered hole transporting layer, emissive layer, and electron transporting layer. For a hole conducting emissive layer, one may have an exciton blocking layer between the emissive layer and the electron transporting layer. For an electron conducting emissive layer, one may have an exciton blocking layer between the emissive layer and the hole transporting layer. The emissive layer may be equal to the hole transporting layer (in which case the exciton blocking layer is near or at the anode) or to the electron transporting layer (in which case the exciton blocking layer is near or at the cathode).

The emissive layer may be formed with a host material in which the emissive molecule resides as a guest. The host material may be a hole-transporting matrix selected from the group of substituted tri-aryl amines. An example of a host material is 4,4'-N,N'-dicarbazole-biphenyl (CBP), which has the formula

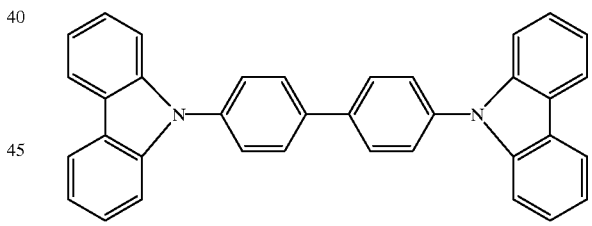

The emissive layer may also contain a polarization molecule, present as a dopant in said host material and having a dipole moment, that affects the wavelength of light emitted when said emissive dopant molecule luminesces.

A layer formed of an electron transporting material is used to transport electrons into the emissive layer comprising the emissive molecule and the optional host material. The electron transport material may be an electron-transporting matrix selected from the group of metal quinoxolates, oxidazoles and triazoles. An example of an electron transport material is tris-(8-hydroxyquinoline) aluminum $(Alq_3)$.

A layer formed of a hole transporting material is used to transport holes into the emissive layer comprising the emissive molecule and the optional host material. An example of a hole transporting material is 4,4'-bis[N-(1-naphthyl)-N-phenyl-amino] biphenyl ["a-NPD"].

The use of an exciton blocking layer ("barrier layer") to confine excitons within the luminescent layer ("luminescent zone") is greatly preferred. For a hole-transporting host, the blocking layer may be placed between the luminescent layer and the electron transport layer. An example of a material for such a barrier layer is 2,9-dimethyl-4,7-diphenyl-1,10-phenanthroline (also called bathocuproine or BCP), which has the formula

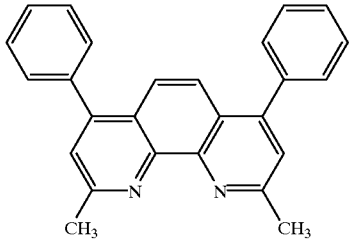

IV. BRIEF DESCRIPTION OF THE DRAWINGS

FIG. 1. Proposed energy transfer mechanisms in the multi-step system Ideally, all excitons are transferred to the singlet state of the fluorescent dye, as triplets in the dye non-radiatively recombine. Forster transfers are represented by solid lines and Dexter transfers by dotted lines. Electron-hole recombination creates singlet and triplet excitons in the host material. These excitons are then transferred to the phosphorescent sensitizer. There is also a lower probability of direct transfer to the fluorescent dye by Förster transfer into the singlet state, or Dexter transfer into the triplet state. This latter mechanism is a source of loss and this is signified in the figure by a cross. Singlet excitons in the phosphor are then subject to intersystem crossing (ISC) and transfer to the triplet state. From this state, the triplets may either dipole-dipole couple with the singlet state of the fluorescent dye or in another loss mechanism, they may Dexter transfer to the triplet state. Note also that electron-hole recombination is also possible on the phosphor and fluorescent dye. Direct formation of triplets on the fluorescent dye is an additional loss. Inset. The structure of electroluminescent devices fabricated in this work. The multiple doped layers are an approximation to a mixed layer of CBP: 10% Ir(ppy)$_3$: 1% DCM2. Two variants were also made. Second device: The Ir(ppy)$_3$ was exchanged with Alq$_3$ to examine the case where the intermediate step is fluorescent and not phosphorescent. Third device: Separately, a device containing a luminescent layer of CBP: 1% DCM2 was made to examine direct transfers between CBP and DCM2.

Figure 2:
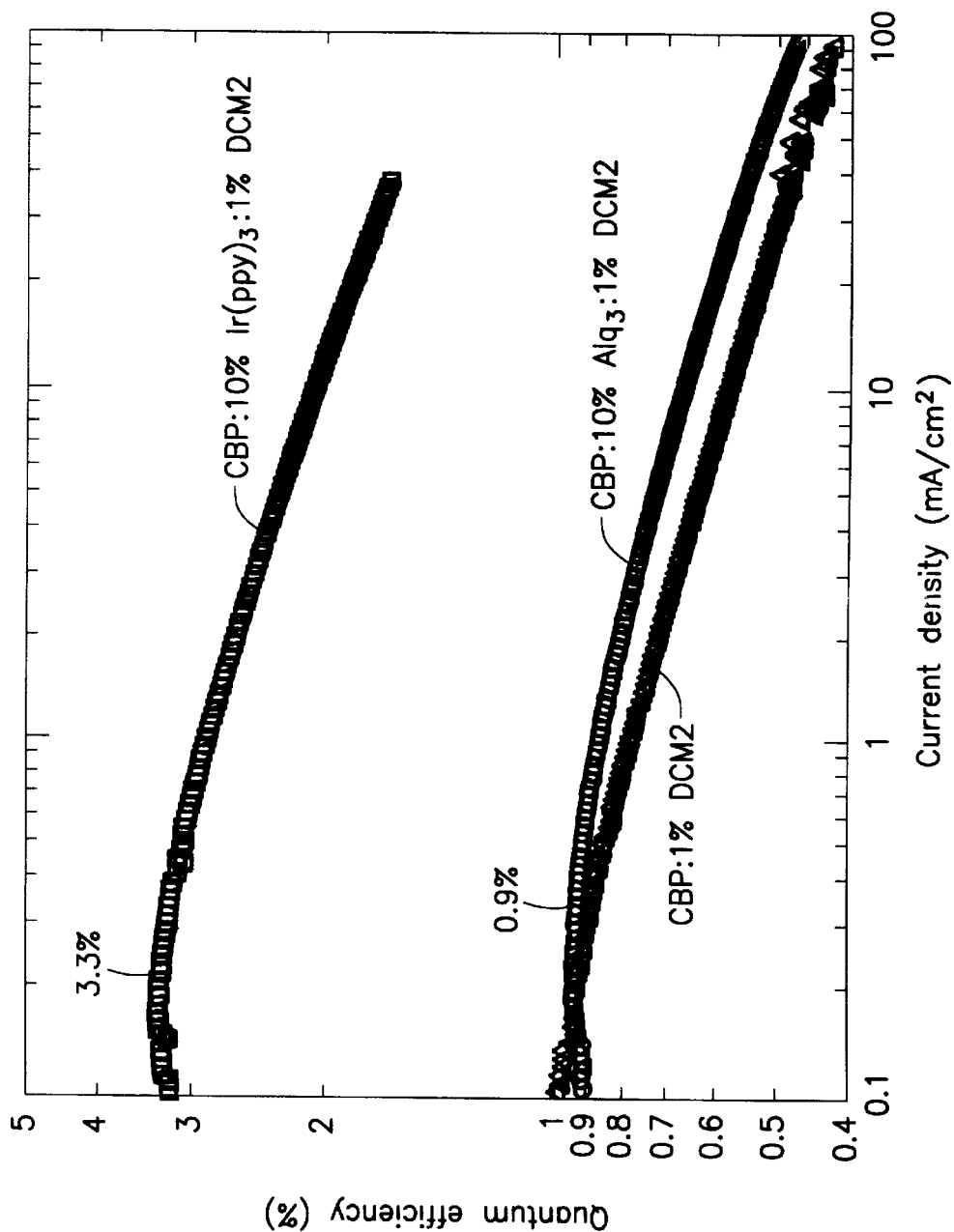

FIG. 2. The external quantum efficiencies of DCM2 emission in the three devices. The sensitizing action of Ir(ppy)$_3$ clearly improves the efficiency. Note also the presence of Alq$_3$ in the all-fluorescent devices makes little or no difference.

Figure 3:
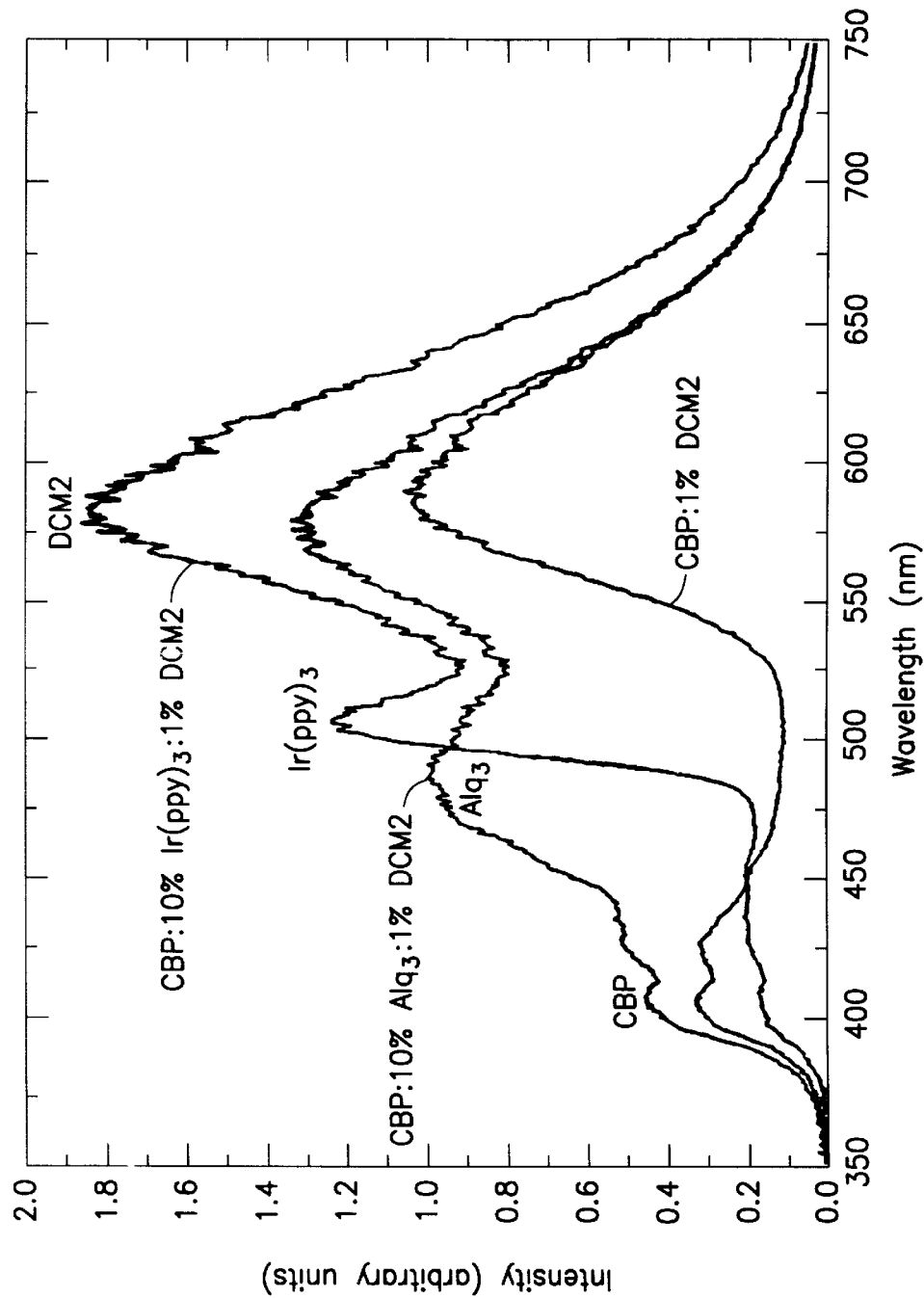

FIG. 3. In the spectra of the three devices, characteristic peaks are observed for CBP ($\lambda$~400 nm), TPD ($\lambda$~420 nm), Alq$_3$ ($\lambda$~490 nm) Ir(ppy)$_3$ ($\lambda$~400 nm) and DCM2 ($\lambda$~590 nm). Approximately 80% of the photons in the Ir(ppy)$_3$ device are emitted by DCM2. All spectra were recorded at a current density of ~1 mA/cm$^2$.

Figure 4:
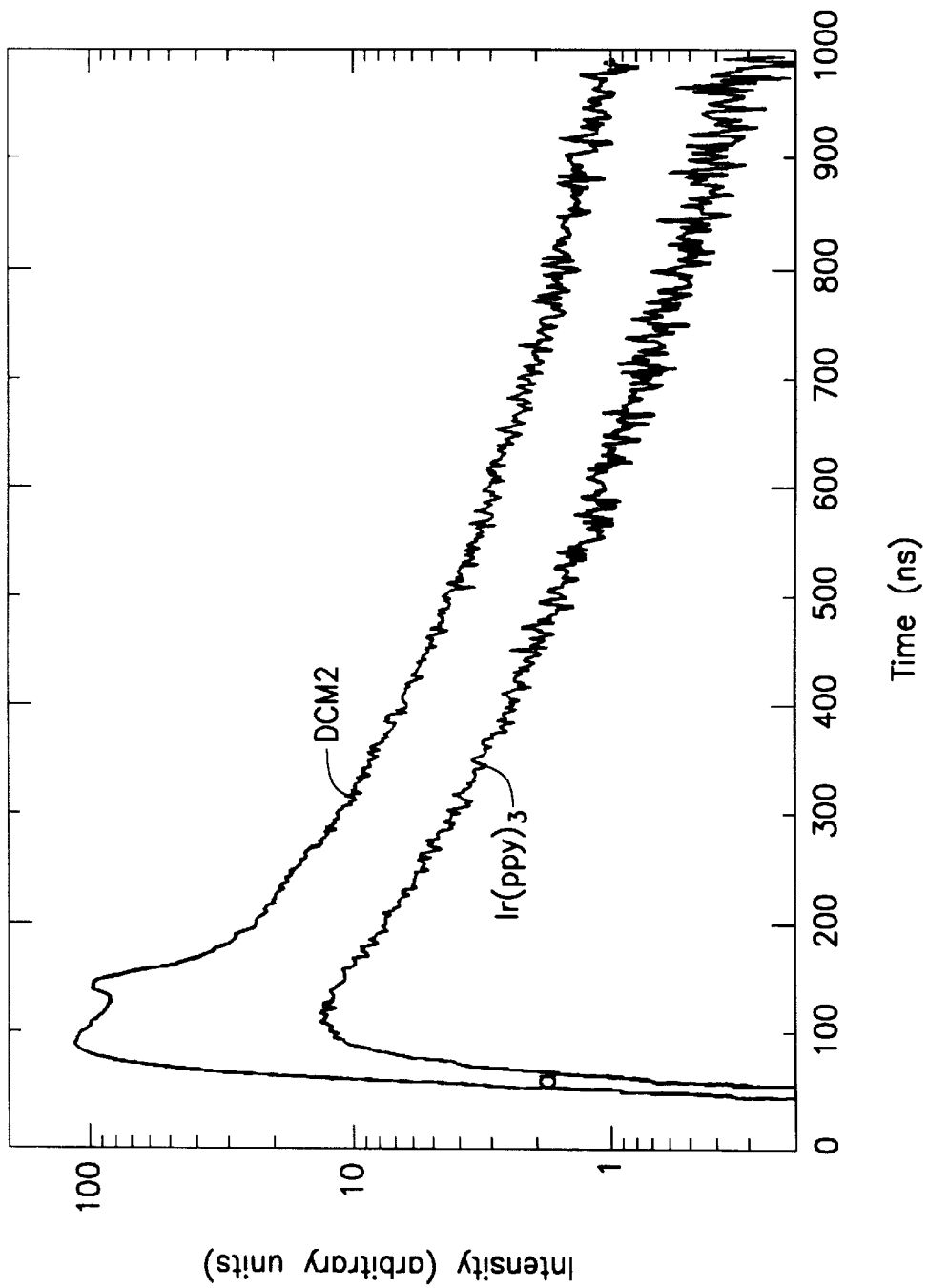

FIG. 4. The transient response of the DCM2 and Ir(ppy)$_3$ components in the CBP: 10% Ir(ppy)$_3$: 1% DCM2 device. The transient lifetime of DCM2 is ~1 ns, thus in the case of energy transfer from Ir(ppy)$_3$, the response of DCM2 should be governed by the transient lifetime of Ir(ppy)$_3$. After the initial 100 ns-wide electrical excitation pulse, this is clearly the case, demonstrating that energy is transferred from the triplet state in Ir(ppy)$_3$ to the singlet state in DCM2. However, during the excitation pulse, singlet transfer to DCM2 is observed, resulting in the ripples in the transient response. These ripples are due to fluctuations in the current density and the discharge of traps at the falling edge of the pulse. Note that the trends in the DCM2 and Ir(ppy)$_3$ transient response eventually diverge slightly. This is due to a small amount of charge trapped on DCM2 molecules recombining and causing luminescence.

Figure 5:
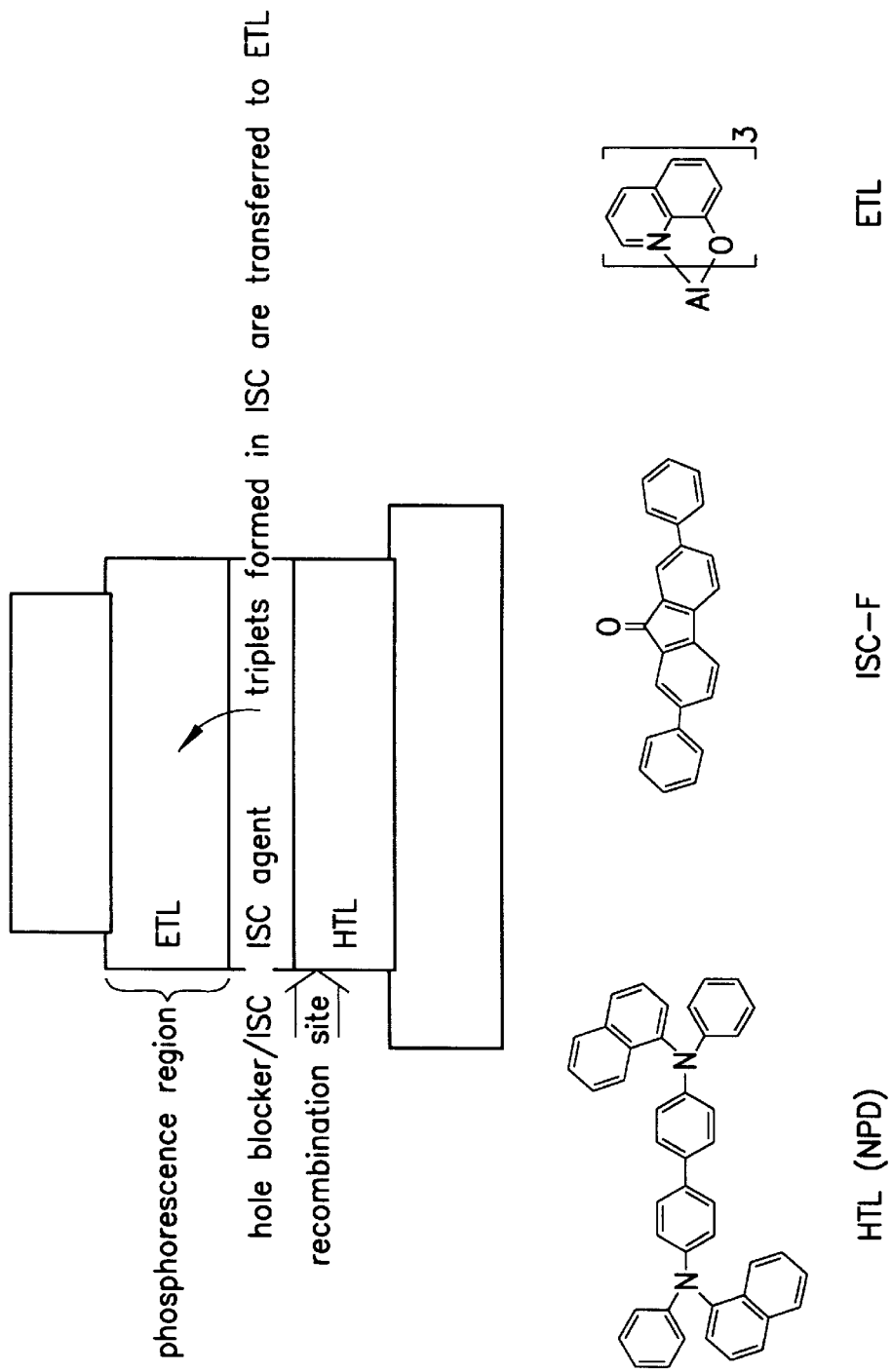

FIG. 5. Schematic of device containing a layer of ISC agent between ETL and HTL.

Figure 6:
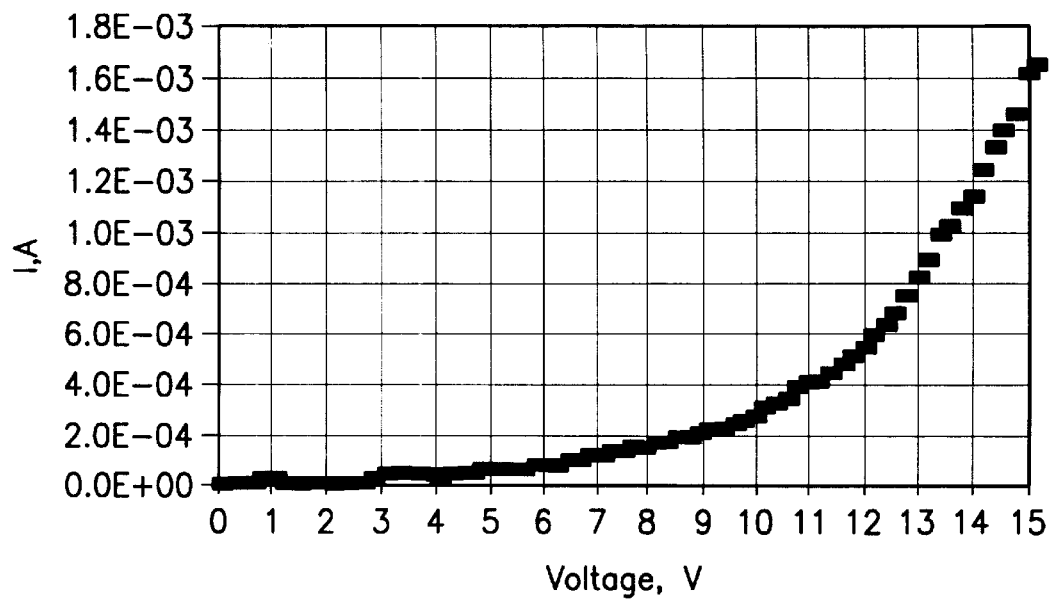
Figure 6:
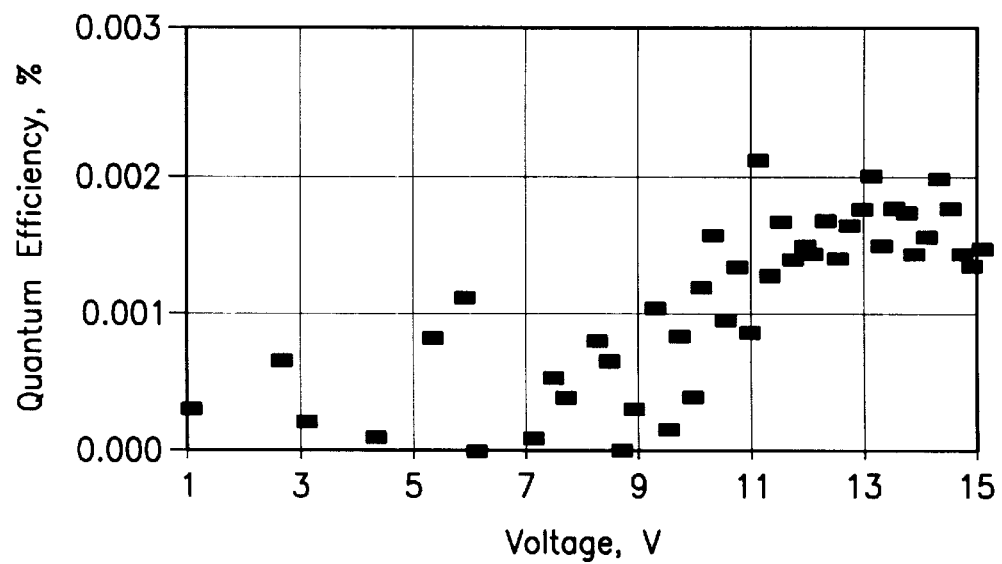

FIG. 6. IV characteristics for the device described in Example 5/FIG. 5.

V. DETAILED DESCRIPTION OF THE INVENTION

The present invention is directed to organic light emitting devices (OLEDs) comprised of emissive layers that contain an organic compound functioning as an emitter and a separate intersystem crossing ("ISC") molecule which operates to enhance the efficiency of the emission. Embodiments are described which enhance emission efficiency for fluorescent emitters and for phosphorescent emitters.

It is preferred that there be substantial spectral overlap between the ISC molecule and the emissive molecule. One way of measuring spectral overlap is by integrating absorption and emission spectra over the range of energies (wavenumbers) over which both spectra have non-zero values. This approach is related to that taken in Equation 2(a) of A. Shoustikov, Y. You, and M. E. Thompson, "Electroluminescence Color Tuning by Dye Doping in Organic Light Emitting Diodes," IEEE Journal of Special Topics in Quantum Electronics, 1998, 4, 3–14. One approach is to normalize the absorption and emission spectra to integrated intensities of one. One integrates the product of the normalized spectra over the range of energies where both spectra have non-zero values. This range may be taken to be 180 nm to 1.5 microns in wavelength. If the value is at least 0.01, and more preferably at least 0.05, one has substantial spectral overlap.

It is also preferred that there be substantial spectral overlap between the emission spectrum of the host material and the absorption spectrum of the ISC agent. One integrates the product of the normalized spectra over the range of energies where both spectra have non-zero values. This range may be taken to be 180 nm to 1.5 microns in wavelength. If the value is at least 0.01, and more preferably at least 0.05, one has substantial spectral overlap.

The present invention will now be described in detail for specific preferred embodiments of the invention, it being understood that these embodiments are intended only as illustrative examples and the invention is not to be limited thereto.

V.A. Use of ISC Agents to Enhance Fluorescent Emission

V.A.1. Overview of First Embodiment

An embodiment of the present invention is generally directed to phosphorescent sensitizers for fluorescent emissive molecules, which luminesce when a voltage is applied across a heterostructure of an organic light-emitting device and which sensitizers are selected from the group of phosphorescent organometallic complexes, and to structures, and correlative molecules of the structures, that optimize the emission of the light-emitting device. The term "organometallic" is as generally understood by one of ordinary skill, as given, for example, in "Inorganic Chemistry" (2nd edition) by Gary L. Miessler and Donald A. Tarr, Prentice-Hall (1998). The invention is further directed to sensitizers within the emissive layer of an organic light-emitting device which molecules are comprised of phosphorescent cyclometallated iridium complexes. Discussions of the appearance of color, including descriptions of CIE charts, may be found in Color Chemistry, VCH Publishers, 1991 and H. J. A. Dartnall, J. K. Bowmaker, and J. D. Mollon, Proc. Roy. Soc. B (London), 1983, 220, 115–130.

V.A.2. Examples of First Embodiment

The structure of the organic devices of Examples 1, 2, and 3 is shown in the inset of FIG. 1.

EXAMPLE 1

Organic layers were deposited by a high vacuum ($10^{-6}$ Torr) thermal evaporation onto a clean glass substrate pre-coated with a 1400 Å-thick layer of transparent and conductive indium tin oxide. A 600 Å-thick layer of N,N'-diphenyl-N,N'-bis(3-methylphenyl)-[1,1'-biphenyl]-4,4'-diamine ["TPD"] is used to transport holes to the luminescent layer. The luminescent layer consisted of an alternating series of 10 Å-thick layers of CBP doped to 10% (by mass) of $Ir(ppy)_3$, and 10 Å thick layers of CBP doped to 1% (by mass) of DCM2. In total, 10 doped layers were grown, with a total thickness of 100 Å. Excitons were confined within the luminescent region by a 200 Å-thick layer of the exciton-blocking material 2,9-dimethyl-4,7-diphenyl-1,10-phenanthroline (also called bathcuproine, or BCP). A 300 Å-thick layer of the electron transport material tris-(8-hydroxyquinoline) aluminum ("$Alq_3$") is used to transport electrons to the luminescent region and to reduce absorption at the cathode. A shadow mask with 1 mm-diameter openings was used to define the cathodes consisting of a 1000 Å-thick layer of 25:1 Mg:Ag, with a 500 Å-thick cap. The compound $Ir(ppy)_3$ [sensitizer/ISC agent in Example 1] has the following formulaic representation:

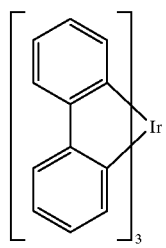

COMPARATIVE EXAMPLE 2

As one control, a device was created as in Example 1, except that $Ir(ppy)_3$ was replaced by $Alq_3$, which has similar emission and absorption spectra, but no observable phosphorescence at room temperature.

COMPARATIVE EXAMPLE 3

As a second control, a device was created as in Example 1, except that the intermediate energy transfer step was omitted to examine direct energy transfer from CBP to DCM2.

Results of Examples 1, 2, and 3

The external quantum efficiency (photons per electron) as a function of injection current of the DCM2 portion of the emission spectrum for each example is given in FIG. 2. The DCM2 emission efficiency of the device containing the phosphorescent sensitizer is significantly higher than its fluorescent analog. Indeed, the peak efficiency of (3.3±0.1) %, significantly higher than the best result of ~2% observed for DCM2 in previous studies (C. H. Chen, C. W. Tang, J. Shi, and K. P. Klubeck, "Improved red dopants for organic luminescent devices," Macromolecular Symposia, 1997, 125, 49–58)). This demonstrates that host triplets are transferred to the fluorescent singlet state in Example 1. As a more quantitative comparison of the increase in emission due to the sensitizer, we note the difference in the quantum efficiency of DCM2 emission, where the maximum efficiency is 0.9±0.1% in the example without the phosphorescent sensitizer and 3.3% in the example with phosphorescent sensitizer [Refer to FIG. 2 and the addition of $Alq_3$ to the CBP:DCM2 device in Comparative Example 2.] The ratio of efficiency of sensitized to unsensitized devices is 3.7±0.4, which is close to the value of four (4) expected between emission of (singlet+triplet) to (only singlet) [that is, (1+3)/ (1+0)] for devices in which the probability of both singlet and triplet participation is equal.

The emission spectra of the OLEDs of the three examples are given in FIG. 3. All devices show energy transfer to the fluorescent dye. By taking the area under the various spectral peaks, we find that approximately 80% of photons are emitted by DCM2 in the device containing the $Ir(ppy)_3$ sensitizer. The remainder contribute to CBP luminescence at $\lambda$~400 nm, TPD luminescence at $\lambda$~420 nm, and $Ir(ppy)_3$ luminescence at $\lambda$~500 nm. In the device doped with 10% $Alq_3$, an emission peak is observed at $\lambda$~490 nm. This is consistent with observations of $Alq_3$ emission in a non-polar host (CBP). (V. Bulovic, R. Deshpande, M. E. Thompson, and S. R. Forrest, "Tuning the color emission of thin film molecular organic light emitting devices by the solid state solvation effect," Chemical Physics Letters (1999).

Conclusive evidence of the energy transfer process in Eq. 2 is shown in FIG. 4, which illustrate the transient behavior of the DCM2 and $lr(ppy)_3$ components of the emission spectra. These data were obtained by applying a 100 ns electrical pulse to the electroluminscent device The resulting emission was measured with a streak camera. If a fraction of the DCM2 emission originates via transfer from $Ir(ppy)_3$ triplets (Eq. 2), then the proposed energy transfer must yield delayed DCM2 fluorescence. Furthermore, since the radiative lifetime of DCM2 is much shorter than that of $ir(ppy)_3$, the transient decay of DCM2 should match that of $lr(ppy)_3$. After an initial peak, most probably due to singlet-singlet transfer (Eq. 2), the DCM2 decay does indeed follow the $Ir(ppy)_3$ decay. The transient lifetime of $Ir(ppy)_3$ in this system is ~100 ns, compared to a lifetime of ~500 ns in the absence of DCM2, confirming an energy transfer of ~80%. The decrease in the triplet lifetime as a result of energy transfer to the fluorescent acceptor is advantageous. Not only does it increase the transient response of the system but also it has been shown that the probability of triplet-triplet annihilation varies inversely with the square of the triplet lifetime. (M. A. Baldo, M. E. Thompson, and S. R. Forrest, "An analytic model of triplet-triplet annihilation in electrophosphorescent devices," (1999).) Thus, it is expected that this multi-stage energy transfer will reduce the quenching of triplet states, thereby further enhancing the potential for higher efficiency sensitized fluorescence.

The three examples demonstrate a general technique for improving the efficiency of fluorescence in guest-host organic systems. Further improvement may be expected by mixing the host, phosphorescent sensitizer, and fluorescent dye rather than doping in thin layers as in this work, although the thin layer approach inhibits direct Dexter transfer of triplets from the host to the fluorophore where they would be lost. To reduce losses further in the multi-state energy transfer, an ideal system may incorporate low concentrations of a sterically hindered dye. For example, adding spacer groups to the DCM2 molecule should decrease the probability of Dexter transfer to the dye while minimally affecting its participation in Forster transfer or its luminescence efficiency. Since Dexter transfer can be understood as the simultaneous transfer of an electron and a hole, steric hindrance may also reduce the likelihood of charge trapping on the fluorescent dye. Similar efforts have already reduced non-radiative excimer formation in a DCM2 variant [Chen, Tang, Shi and Klubeck, "Improved red dopants for organic EL Devices, Macromolecular Symposia, 1997, 125, 49–58]. Also, optimization of the device structure will reduce Ir(ppy)$_3$ emission to lower levels.

V.B. Use of ISC Agents to Enhance Phosphorescent Emission

V.B.1. Overview of Second Embodiment

The second embodiment is directed to the situation wherein the emissive molecule is phosphorescent and the use of intersystem crossing molecules enhances the efficiency of the phosphorescent emission.

V.B.2. Example of Second Embodiment

Prophetic Example 4.

An OLED is fabricated with a traditional diamine hole transporter and an electron transporting layer (ETL) composed of three different materials. The ETL is roughly 80% a traditional electron transporting material (such as Zrq4), 15% an intersystem crossing agent (such as benzil; other ISC agents may be found in the reference of Gilbert and Baggott) and 5% a phosphorescent emitter (such as PtOEP, platinum octaethyl porphyrin). The ISC agent is chosen so that its absorption spectrum overlaps strongly with the ETL's fluorescence spectrum. Hole electron recombination occurs at or near the HTL/ETL interface generating a mixture of singlet and triplet excitons. The singlet excitons on the ETL will efficiently transfer their energy to the ISC agent, which will efficiently intersystem cross to its triplet state, via a n→π* state or some other suitable process.

The triplet energy of the ISC agent will then transfer to the dopant and emission will occur at the phosphorescent dopant. Triplet excitons formed on the ETL will either transfer directly to the dopant or energy transfer to the ISC agent, which will transfer that energy to the dopant as described. The ISC agent in this application is designed to completely quench singlet excitons giving a good yield of triplet excitons for transfer to the phosphorescent dopant.

The chemical formula of Zrq$_4$ is

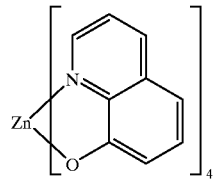

V.C. Use of Intersystem Crossing Agent as Filter and Converter

V.C.1. Overview of Third Embodiment

In this third embodiment of the present invention, a thin layer of an ISC agent is placed between the HTL and ETL. The ISC agent is selected such that the optical absorption spectrum of the ISC agent overlaps strongly with the emission line of the material found at the site of recombination.

In the control experiments discussed below, we utilized 2,7 diphenyl fluorenone ("ISC-F") as the ISC agent. An ISC agent suitable for the filter/converter embodiment can be selected from the group consisting of acridines, acridones, brominated polycyclic aromatic compounds, anthraquinones, alpha-beta-diketones, phenazines, benzoquinones, biacetyls, fullerenes, thiophenes, pyrazines, quinoxalines, and thianthrenes.

V.C.2. Examples of Third Embodiment

EXAMPLE 5

In FIGS. 5 and 6, we present control experiments for a device without a phosphorescent dopant emitter. An example of the third embodiment can have a phosphorescent emitter in the ETL layer.

The structure of the device for this example is given schematically in FIG. 5. It is made of a heterostructure with α-NPD/ISC-F/Alq3. (The Alq3 layer is not doped). The IV characteristic of the device is given in FIG. 6. The device area here is 3.14 mm$^2$. The key point is that there is no light at low to medium bias. This result shows that the ISC filter/converter certainly quenches singlets. [At very high biases (>17 Volts) weak green emission can be observed. The spectrum of this output shows that it is from Alq3. To explain the emission, either there are electrons leaking through to Alq3 at high bias or the ISC-F is transferring energy back to the singlet in Alq3.]

In the device corresponding to the third embodiment of the present invention, the Alq3 region is doped with a phosphorescent emitter. We would know that triplet excitons have been efficiently injected into the Alq3 layer because of phosphorescent emission arising from the doped emitter.

In the embodiment of the invention contemplated, the 2,7-diphenyl fluorenone ("ISC-F") transports electrons to the α-NPD/ISC-F interface. Hole/electron recombination at or near this interface leads to both singlet and triplet excitons. Both of these excitons will be readily transferred to the ISC-F layer. Any singlet that transfers to the ISC-F layer (or is formed in it) will rapidly intersystem cross to a triplet. Thus, all of the excitons present will be efficiently converted to triplets within the device.

Specifically, the triplet excitons will diffuse through the ISC-F layer and transfer to the Alq$_3$ layer. The transfer to Alq$_3$ should be facile. Although the triplet energy of Alq$_3$ is not exactly known, it is believed to be between 550 and 600 nm. This is exactly in the correct region to efficiently trap triplet excitons from ISC-F. Using the ISC agent in this way we prevent singlet excitons from ever reaching the emissive region of the device. By doping the emissive region with a phosphorescent dye, we an efficiently extract the energy luminescently. The ISC agent here is acting as a filter which only allows triplet excitons to be injected into the Alq$_3$ layer. The requirements for such an ISC filter/converter are that it have both singlet and triplet energies below that of the material that is at or near the site of recombination (α-NPD in the example) and a triplet energy higher than the emissive region (which must not be the site of recombination, Alq$_3$ in the example). The material must have a high ISC efficiency.

V.D. Other Discussion

V.D.1. Spectral Overlap

In the embodiments of the present invention, there should be spectral overlap between the emissive molecule and the intersystem crossing molecule. The nature of the overlap may depend upon the use of the device, which uses include a larger display, a vehicle, a computer, a television, a printer, a large area wall, theater or stadium screen, a billboard and a sign. For display applications of the device of the present invention, there should be spectral overlap in the visible spectrum. For other applications, such as the use of this device in printing, the overlap of the emission with the human photopic response may not be required.

V.D.2. Other Examples of Sensitizer/ISC Agent for First Embodiment

The embodiment of the present invention for enhancing fluorescent emission is not limited to the sensitizer molecule of the examples. One contemplates the use of metal complexes wherein there is sufficient spin orbit coupling to make the radiative relaxation an allowed process. Of ligands, one of ordinary skill may modify the organic component of the Ir(ppy)$_3$ (directly below) to obtain desirable properties.

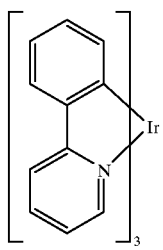

One may have alkyl substituents or alteration of the atoms of the aromatic structure.

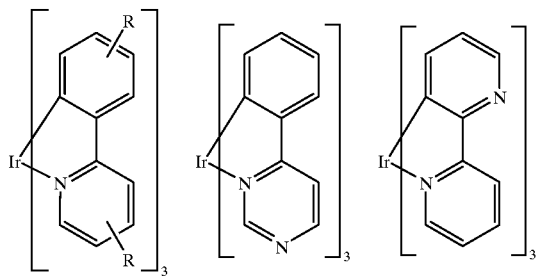

These molecules, related to Ir(ppy)$_3$, can be formed from commercially available ligands. The R groups can be alkyl or aryl and are preferably in the 3, 4, 7 and/or 8 positions on the ligand (for steric reasons).

Other possible sensitizers are illustrated below.

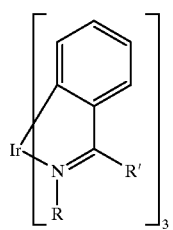

This molecule is expected to have a blue-shifted emission compared to Ir(ppy)$_3$. R and R' can independently be alkyl or aryl.

Organometallic compounds of osmium may be used in this invention. Examples are the following.

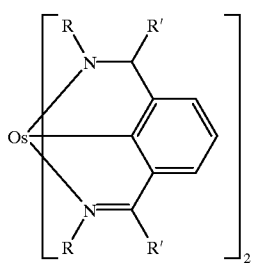

These osmium complexes will be octahedral with 6d electrons (isoelectronic with the Ir analogs) and may have good intersystem crossing efficiency. R and R' are independently selected from the group consisting of alkyl and aryl. They are believed to be unreported in the literature.

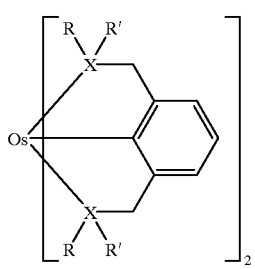

Herein, X can be selected from the group consisting of N or P. R and R' are independently selected from the group alkyl and aryl.

V.D.3. Other Molecular Depictions

A molecule for the hole-transporting layer of the invention is depicted below.

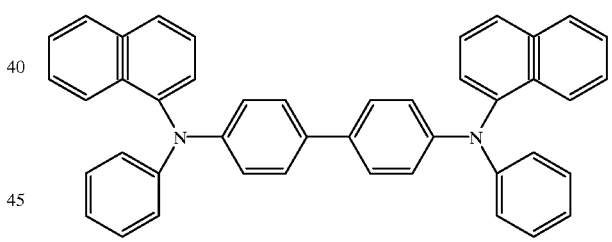

The invention will work with other hole-transporting molecules known by one of ordinary skill to work in hole transporting layers of OLEDs.

A molecule used as the host in the emissive layer of the invention is depicted below.

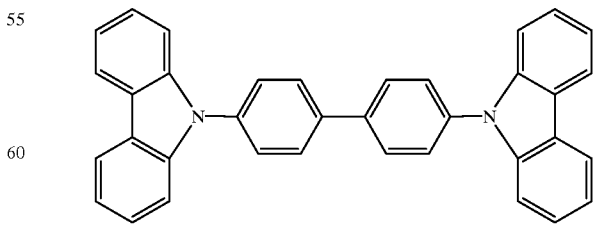

The invention will work with other molecules known by one of ordinary skill to work as hosts of emissive layers of OLEDs. For example, the host material could be a hole-transporting matrix and could be selected from the group consisting of substituted tri-aryl amines and polyvinylcarbazoles.

The molecule used as the exciton blocking layer of Example 1 is depicted below. The invention will work with other molecules used for the exciton blocking layer, provided they meet the requirements given herein.

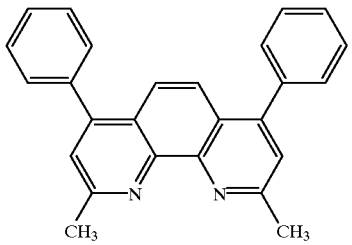

V.D.4. Uses of Device

The OLED of the present invention may be used in substantially any type of device which is comprised of an OLED, for example, in OLEDs that are incorporated into a larger display, a vehicle, a computer, a television, a printer, a large area wall, theater or stadium screen, a billboard or a sign.

The present invention as disclosed herein may be used in conjunction with co-pending applications: "High Reliability, High Efficiency, Integratable Organic Light Emitting Devices and Methods of Producing Same", Ser. No. 08/774,119 (filed Dec. 23, 1996); "Novel Materials for Multicolor Light Emitting Diodes", Ser. No. 08/850,264 (filed May 2, 1997); "Electron Transporting and Light Emitting Layers Based on Organic Free Radicals", Ser. No. 08/774,120 (filed Dec. 23, 1996); "Multicolor Display Devices", Ser. No. 08/772,333 (filed Dec. 23, 1996); "Red-Emitting Organic Light Emitting Devices (OLED's)", Ser. No. 08/774,087 (filed Dec. 23, 1996); "Driving Circuit For Stacked Organic Light Emitting Devices", Ser. No. 08/792,050 (filed Feb. 3, 1997); "High Efficiency Organic Light Emitting Device Structures", Ser. No. 08/772,332 (filed Dec. 23, 1996); "Vacuum Deposited, Non-Polymeric Flexible Organic Light Emitting Devices", Ser. No. 08/789,319 (filed Jan. 23, 1997); "Displays Having Mesa Pixel Configuration", Ser. No. 08/794,595 (filed Feb. 3, 1997); "Stacked Organic Light Emitting Devices", Ser. No. 08/792,046 (filed Feb. 3, 1997); "High Contrast Transparent Organic Light Emitting Devices", Ser. No. 08/792,046 (filed Feb. 3, 1997); "High Contrast Transparent Organic Light Emitting Device Display", Ser. No. 08/821,380 (filed Mar. 20, 1997); "Organic Light Emitting Devices Containing A Metal Complex of 5-Hydroxy-Quinoxaline as A Host Material", Ser. No. 08/838,099 (filed Apr. 15, 1997); "Light Emitting Devices Having High Brightness", Ser. No. 08/844,353 (filed Apr. 18, 1997); "Organic Semiconductor Laser", Ser. No. 08/859,468 (filed May 19, 1997); "Saturated Full Color Stacked Organic Light Emitting Devices", Ser. No. 08/858,994 (filed on May 20, 1997); "Plasma Treatment of Conductive Layers", PCT/US97/10252, (filed Jun. 12, 1997); "Novel Materials for Multicolor Light Emitting Diodes", Ser. No. 08/814,976, (filed Mar. 11, 1997); "Novel Materials for Multicolor Light Emitting Diodes", Ser. No. 08/771,815, (filed Dec. 23, 1996); "Patterning of Thin Films for the Fabrication of Organic Multi-color Displays", PCT/US97/10289, (filed Jun. 12, 1997), and "Double Heterostructure Infrared and Vertical Cavity Surface Emitting Organic Lasers", (filed Jul. 18, 1997), each co-pending application being incorporated herein by reference in its entirety.

What is claimed:

1. An organic light emitting device comprising a heterostructure for producing luminescence, comprising an emissive layer, wherein the emissive layer is a combination of a host material and an emissive molecule, present as a dopant in said host material;

wherein the emissive molecule is adapted to luminesce when a voltage is applied across the heterostructure; and wherein the heterostructure comprises an intersystem crossing molecule such that the efficiency of the emission is enhanced by the use of the intersystem crossing molecule.

2. The organic light emitting device of claim 1 wherein the emission spectrum of the intersystem crossing molecule substantially overlaps the absorption spectrum of the emissive molecule.

3. An organic light emitting device comprising a heterostructure for producing luminescence, comprising an emissive layer, wherein the emissive layer is a combination of a conductive host material and a fluorescent emissive molecule, present as a dopant in said host material;

wherein the emissive molecule is adapted to luminesce when a voltage is applied across the heterostructure; and wherein the heterostructure comprises an intersystem crossing molecule which is an efficient phosphor whose emission spectrum substantially overlaps with the absorption spectrum of the emissive molecule.

4. The emissive layer of claim 3, wherein the intersystem crossing molecule is Ir(ppy)$_3$.

5. The device of claim 3 wherein the fluorescent emissive molecule is DCM2.

6. The device of claim 1 wherein the emissive molecule is phosphorescent.

7. The device of claim 2 wherein the emissive molecule is phosphorescent.

8. The device of claim 6 wherein the emissive molecule is PtOEP.

9. The device of claim 1 wherein there is a thin layer comprising intersystem crossing agent, wherein the thin layer is placed between a hole transport layer and an electron transport layer.

10. The device of claim 2 wherein the emissive molecule is phosphorescent and wherein a thin layer comprising intersystem crossing agent inhibits emission from singlet states.

11. The device of claim 2 wherein the emissive molecule is phosphorescent and wherein a thin layer comprising intersystem crossing agent enhances triplet emission.

12. An organic light emitting device comprising a heterostructure for producing luminescence, comprising:

an emission layer comprising
a host material; and
an emissive molecule, present as a dopant in said host material, adapted to luminesce when a voltage is applied across the heterostructure;

a hole transport layer;

an electron transport layer; and an intersystem crossing agent wherein there is substantial spectral overlap between the emission spectrum of the intersystem crossing agent and the absorption spectrum of the emissive molecule.

13. The device of claim 12 wherein emission efficiency increases relative to a device with the emissive molecule but without the intersystem crossing agent.

14. The device of claim 12 with an exciton blocking layer.

15. The device of claim 14 wherein the exciton blocking layer comprises 2,9-dimethyl-4,7-diphenyl-1,10-phenanthroline.

16. The device of claim 12 wherein the emissive molecule is fluorescent and the intersystem crossing agent is an organometallic compound comprising a metal of the third row of the periodic table.

17. The device of claim 12 wherein the emissive molecule is phosphorescent.

18. The device of claim 12 wherein the emissive molecule is phosphorescent and the intersystem crossing agent inhibits emission from singlets.

19. The organic light emitting device of claim 1 used in a member of the group consisting of a larger display, a vehicle, a computer, a television, a printer, a large area wall, theater or stadium screen, a billboard and a sign.

* * * * *

UNITED STATES PATENT AND TRADEMARK OFFICE
CERTIFICATE OF CORRECTION

PATENT NO.    : 6,310,360 B1
DATED         : October 30, 2001
INVENTOR(S)   : Forrest et al.

It is certified that error appears in the above-identified patent and that said Letters Patent is hereby corrected as shown below:

Column 1,
Line 4, please insert the following paragraph:

-- GOVERNMENT RIGHTS
      This invention was made with Government support under Contract No. F33615-94-1-1414 awarded by DARPA. The government has certain rights in this invention. --; and Column 11,
Line 23, after "multi-step system" insert -- . -- before "Ideally".

Signed and Sealed this

Twenty-first Day of January, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,310,360 B1
DATED : October 30, 2001
INVENTOR(S) : Forrest et al.

It is certified that error appears in the above-identified patent and that said Letters Patent is hereby corrected as shown below:

Drawings,
Please replace sheet 6, with the attached new drawing which separately labels the drawing as Fig. 6A and 6B Column 9,
Lines 36-45, please replace the chemical structure with the following:

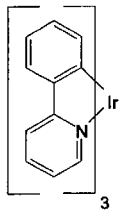

Column 12,
Line 12, change "FIG. 6" to -- FIGS. 6A and 6B. --;

Column 13,
Lines 40-50, please replace the chemical structure with the following:

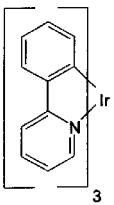

UNITED STATES PATENT AND TRADEMARK OFFICE
CERTIFICATE OF CORRECTION

PATENT NO. : 6,310,360 B1
DATED : October 30, 2001
INVENTOR(S) : Forrest et al.

It is certified that error appears in the above-identified patent and that said Letters Patent is hereby corrected as shown below:

Column 16,
Line 15, after "FIGS. 5" change "and 6" to -- , 6A and 6B --;
Line 22, change "FIG.6" to -- FIGS. 6A and 6B --;

Signed and Sealed this

Thirty-first Day of August, 2004

JON W. DUDAS
*Director of the United States Patent and Trademark Office*

Fig. 6a
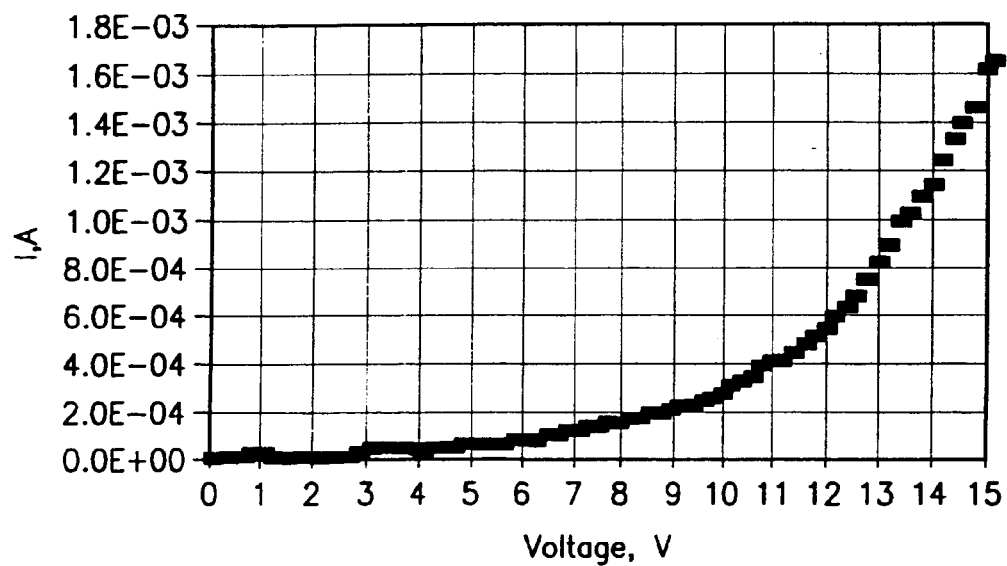
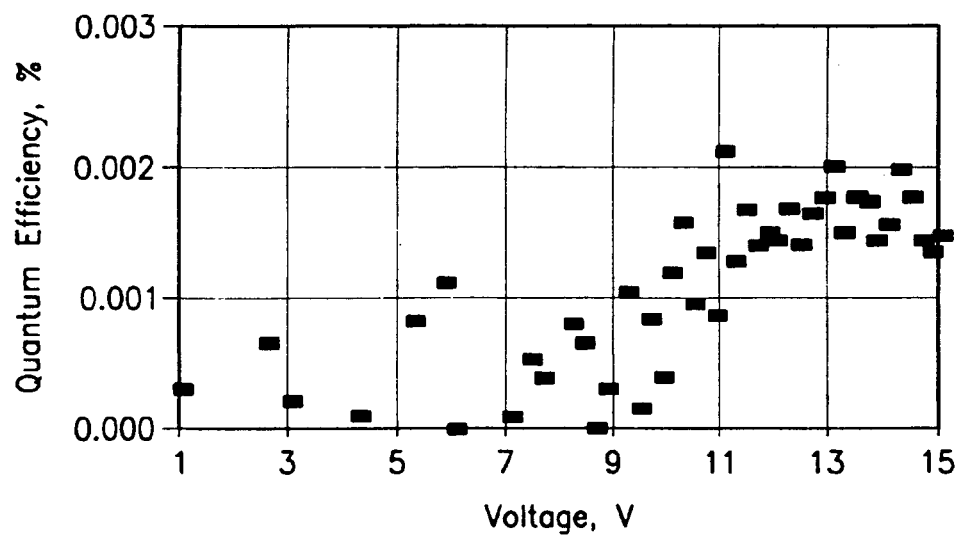
Fig. 6b